(12) United States Patent
Guo

(10) Patent No.: US 12,004,294 B2
(45) Date of Patent: Jun. 4, 2024

(54) CIRCUIT BOARD

(71) Applicants: QING DING PRECISION ELECTRONICS (HUAIAN) CO., LTD, Huai an (CN); Avary Holding (Shenzhen) Co., Limited., Shenzhen (CN)

(72) Inventor: Zhi Guo, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 17/828,295

(22) Filed: May 31, 2022

(65) Prior Publication Data

US 2022/0295632 A1 Sep. 15, 2022

Related U.S. Application Data

(62) Division of application No. 17/029,369, filed on Sep. 23, 2020, now Pat. No. 11,388,818.

(30) Foreign Application Priority Data

Aug. 31, 2020 (CN) .......................... 202010898641.9

(51) Int. Cl.
| | |
|---|---|
| *H05K 1/11* | (2006.01) |
| *H01R 12/71* | (2011.01) |
| *H05K 1/09* | (2006.01) |
| *H05K 3/40* | (2006.01) |

(52) U.S. Cl.
CPC ............... *H05K 1/11* (2013.01); *H01R 12/71* (2013.01); *H05K 1/09* (2013.01); *H05K 3/4038* (2013.01)

(58) Field of Classification Search
CPC ....................................................... H05K 1/11
USPC ....................................................... 174/255
See application file for complete search history.

(56) References Cited

U.S. PATENT DOCUMENTS

| 6,512,182 B2 * | 1/2003 | Takeuchi | ............... H05K 1/185 |
| | | | 29/841 |
| 2006/0037193 A1 * | 2/2006 | Enomoto | ............. H05K 3/4617 |
| | | | 174/262 |
| 2007/0059502 A1 * | 3/2007 | Wang | ................ H01L 21/76873 |
| | | | 428/209 |

(Continued)

FOREIGN PATENT DOCUMENTS

| TW | 201201633 A1 | 1/2012 |
| TW | 201720259 A | 6/2017 |

*Primary Examiner* — Stanley Tso
(74) *Attorney, Agent, or Firm* — ScienBiziP, P.C.

(57) ABSTRACT

A method of manufacturing a base plate includes the following steps: providing a first substrate, the first substrate including a first base layer, a first copper coating and a second copper coating covered on two sides of the first base layer; opening at least one first hole on the first substrate, the first hole penetrating the first base layer and the first copper; forming a first electroplated coating on the first copper coating, the first copper coating filling the first hole to form a first connecting portion; opening at least one second hole on the first connecting portion and the first electroplated coating to form a plurality of second connecting pins.

9 Claims, 12 Drawing Sheets

(56) References Cited

U.S. PATENT DOCUMENTS

2008/0093560 A1* 4/2008 Puhakka ........... H01L 27/14636
250/370.08
2010/0263913 A1* 10/2010 Daubenspeck ......... H01L 24/03
174/250

* cited by examiner

CIRCUIT BOARD

FIELD

The subject matter herein generally relates to a circuit technology, especially relates to a circuit board and a method of manufacturing a base plate and a method of manufacturing the circuit board.

BACKGROUND

In circuit board, Aspect Ratio (AR) of a blind hole is the radio of depth to aperture of the blind hole. With the development of the circuit board, pins number of input or output terminals of the circuit board are increased more and more. Thus, an interval between the blind holes of the circuit board is becoming smaller, and a high AR of the blind hole is further increased. However, in the prior art, manufacturing method of high AR of the circuit board is a difficult process, and the circuit having high AR may have a low reliability.

BRIEF DESCRIPTION OF THE DRAWINGS

Implementations of the present technology will now be described, by way of example only, with reference to the attached figures, wherein.

DETAILED DESCRIPTION

Figure 1:
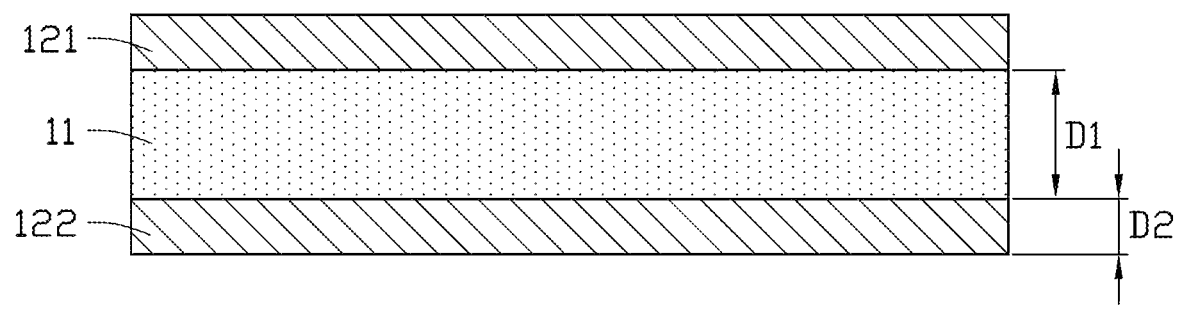
FIG. 1 is an isometric view of a substrate covered with copper . . . .

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a method of manufacturing a base plate. The method of manufacturing the base plate including following steps:

S1: referring to FIG. 1, providing a first substrate 10. The first substrate 10 includes a first base layer 11, a first copper coating 121 and a second copper coating 122 covered on two sides of the first base layer 11.

In this embodiment, materials of the first base layer 11 include at least one polypropylene (PP), polyimide (PI), Benzocyclobutene (BCB), liquid crystal polymer (LCP), Polytetrafluoroethylene (PTEE), etc.

In this embodiment, a thickness of the first base layer 11 is marked as D1, D1=8~250 μm. A thickness of the first copy coating 121 and a thickness of the second copper coating 122 are equivalent and marked as D2, D2=5~250 μm.

Figure 2:
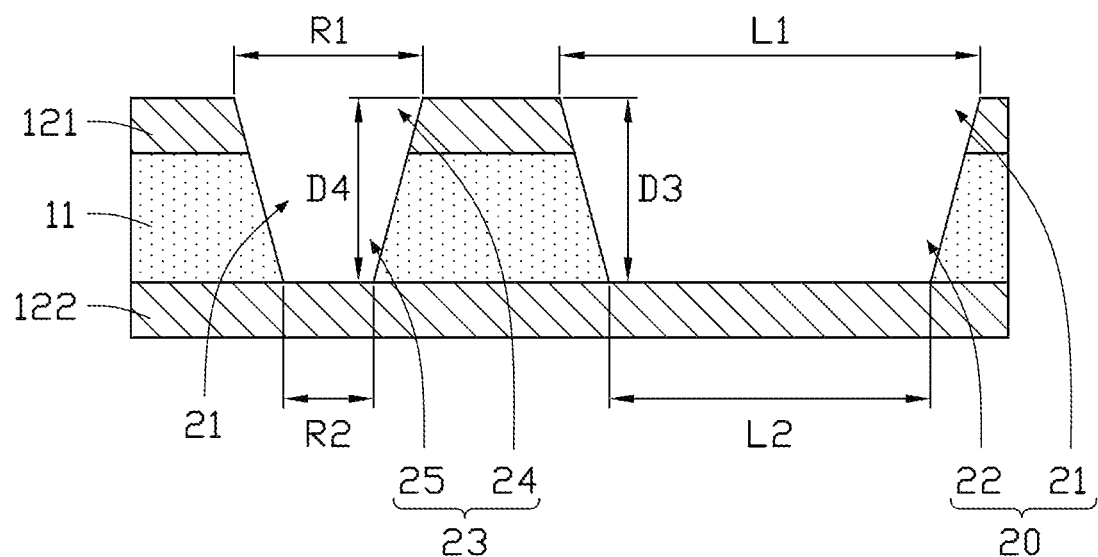
FIG. 2 is an isometric view of opening a first groove on the substrate of FIG. 1.

S2: referring to FIG. 2, opening at least one first hole 20 on the first substrate 10. The first hole 20 is throughout of the first base layer 11 and the first copper coating 121. The second copper coating 122 is exposed from the first hole 20.

In this embodiment, opening the first hole 20 is by laser or machine drilling. A cross-section of the first hole 20 along the first direction P is trapezoidal. The first hole 20 has a first end 21 and a second end 22 opposite to the first end 21. A length of the first end 21 on the cross-section of the first hole 20 is marked as L1, a length of the second end 22 on the cross-section of the first hole 20 is marked as L2, L1>L2.

Figure 3:
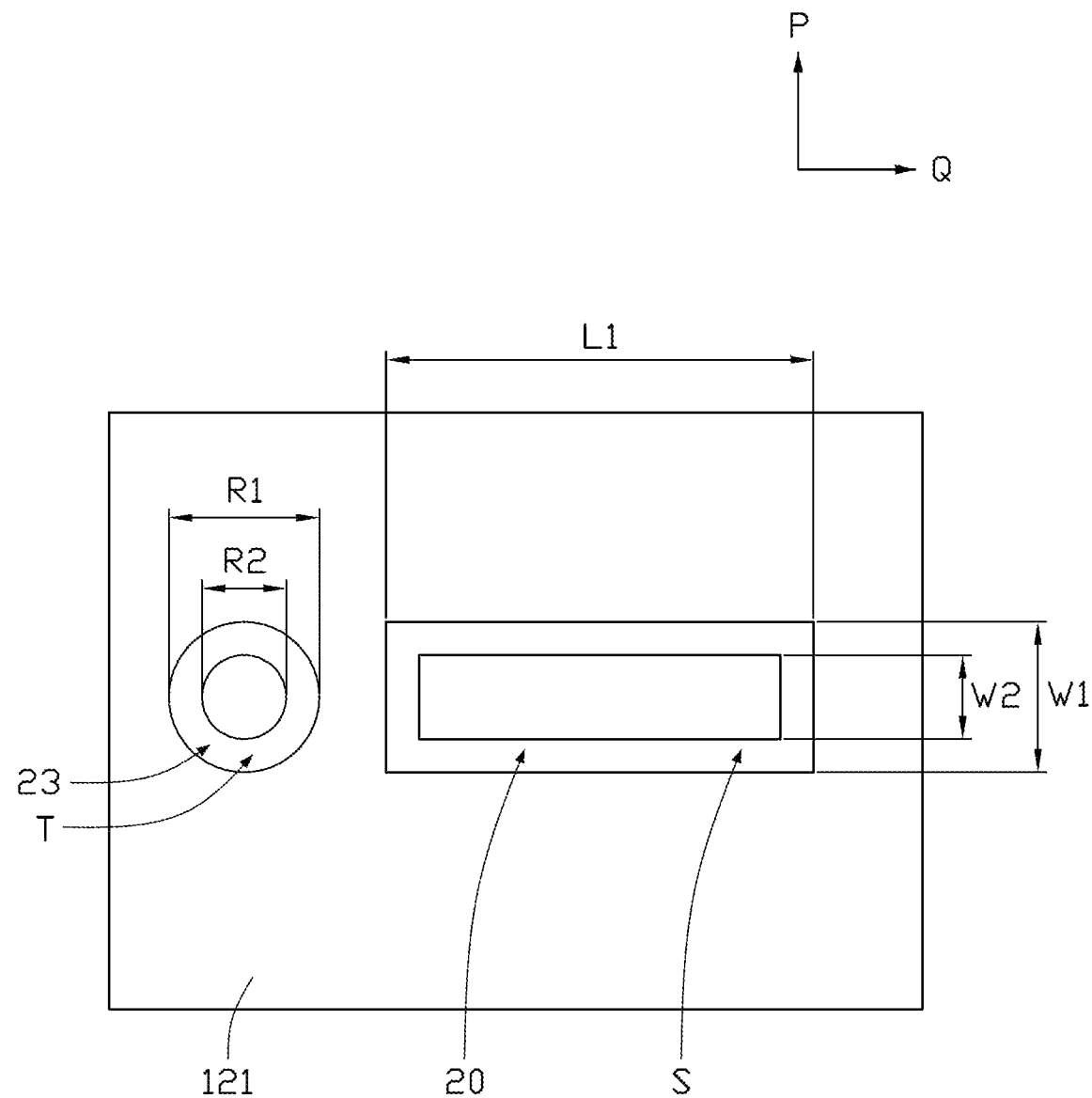
FIG. 3 is top view of FIG. 2.

Further referring to FIG. 3, a projection marked as S of the first end 21 on the first substrate 10 is a rectangle. A width of the projection of the first end 21 is W1, W1=15~275 μm. Further, L1-L2>50 μm.

Figure 4:
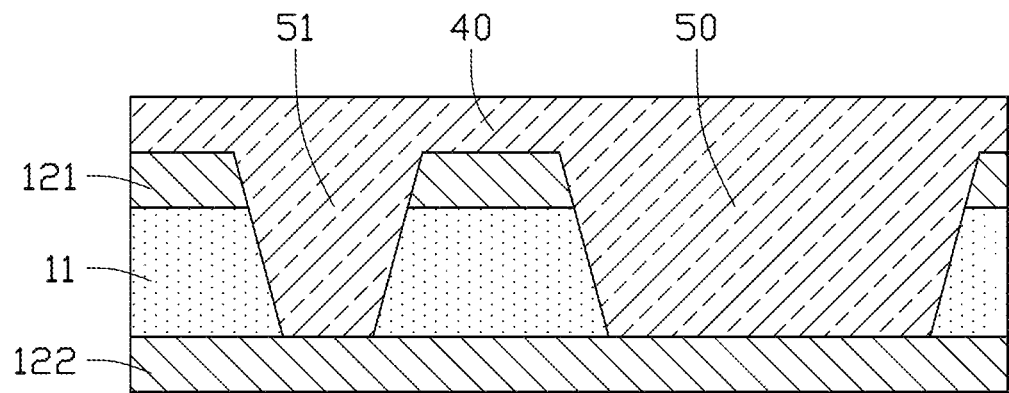
FIG. 4 is an isometric view of forming a first electroplated coating and a first connecting portion on the substrate of FIG. 2.

S3: referring to FIG. 4, forming a first electroplated coating 40 on the first copper coating 121. The first electroplated coating is further filled into the first hole 20 to form a first connecting portion 50.

In this embodiment, before forming the first electroplated coating 40, an auxiliary metal coating (not shown on the FIGS) is formed on the side of the first hole 20 to connect between the first copper coating 121 and the second copper coating 122. The first connecting portion 50 is formed on the auxiliary metal coating.

Figure 5:
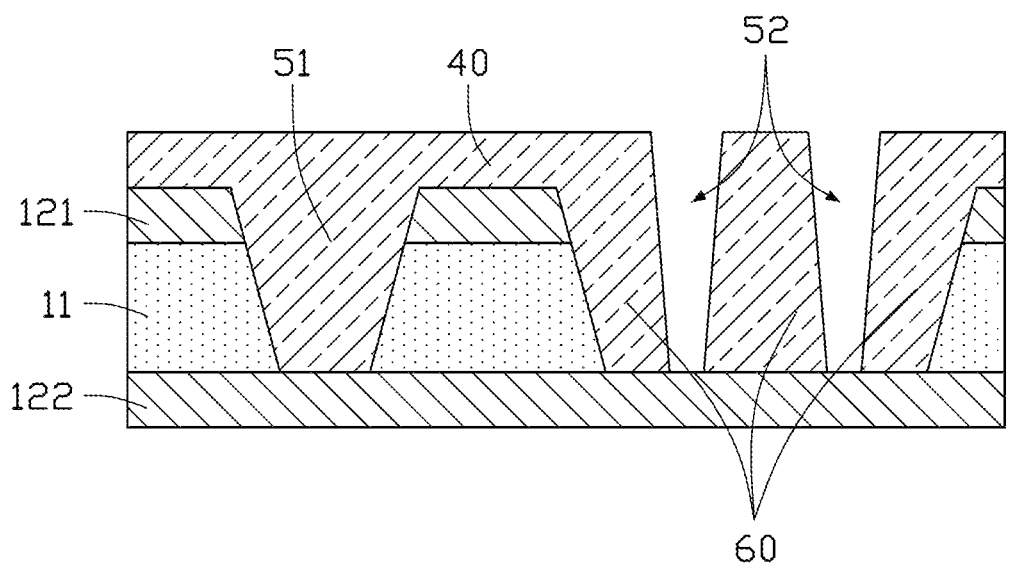
FIG. 5 is an isometric view of opening a second groove on the substrate to form a base plate.
Figure 6:
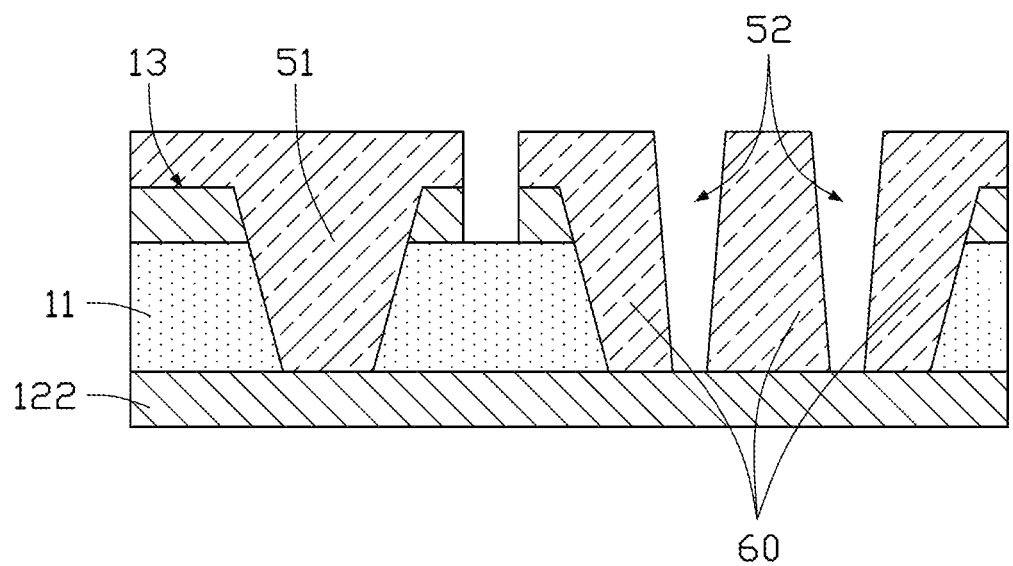
FIG. 6 is an isometric view of a first semi-finished protect.
Figure 7:
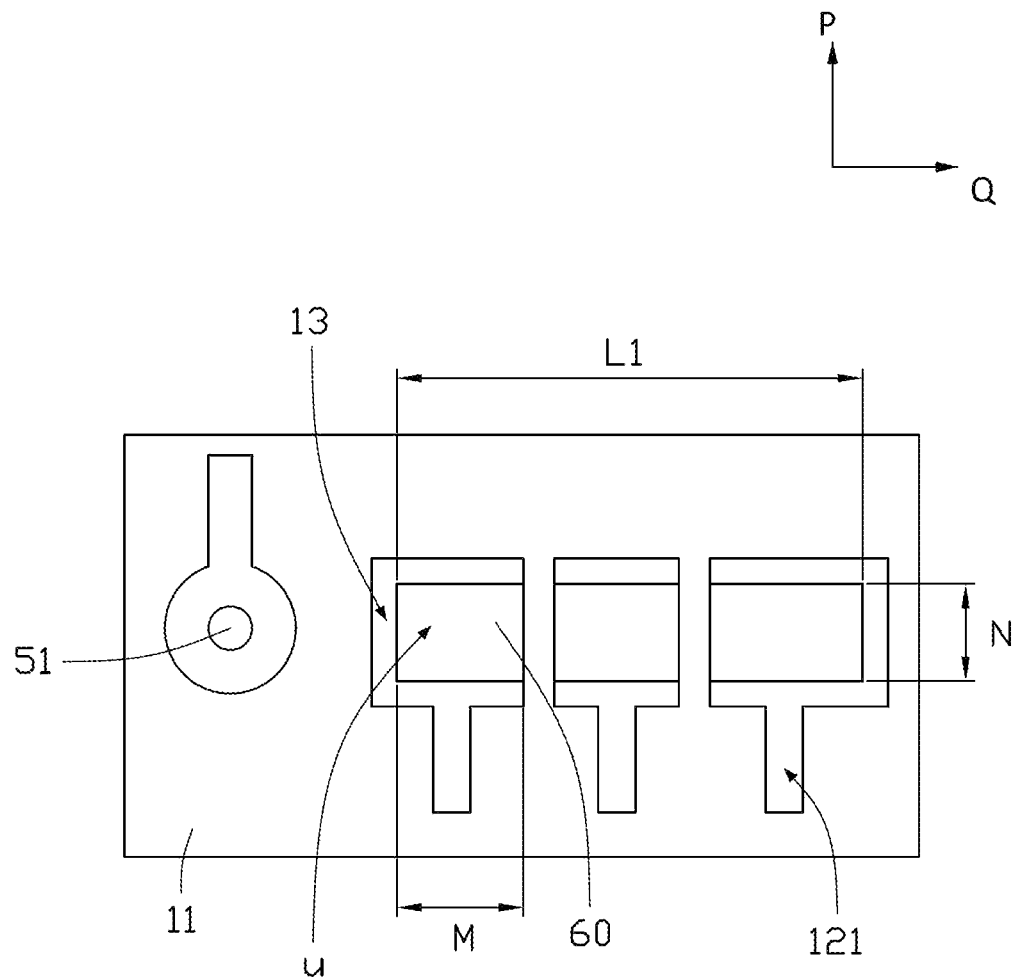
FIG. 7 is a top view of FIG. 6.

S4: referring to FIGS. 5~7, at least one second hole 52 is opened and throughout of the first electroplated coating 40 and the first connecting portion 50. Thus, the first connecting portion 50 and the first electroplated coating 40 corresponding to the first connecting portion 50 are divided into a plurality of second connecting pins 60. The second copper coating 122 is exposed from the second hole 52. The plurality of second connecting pins 60 are used to as input or output end to couple with other electronic components. Thus, a circuit board 70 is manufactured completely.

In this embodiment, a projection of ends of the second connecting pins away from the second copper coating 122 is marked as U. The projection U is rectangular. A length of the projection U is 180~280 μm. A width of the projection U is 15~275 μm. The first substrate 10 has a first direction P and a second direction Q perpendicular to the first direction P. The aspect ratio of the second connecting pins along the first direction P is defined as D3/M, D3=8~250 μm, M=180~280 μm, D3/M=0.03~1.40. In preferably embodiment, D3=112 μm, M=187.5 μm, D3/M=0.60. The aspect ratio of the second connecting pins along a second direction Q is defined as D3/N, D3=8~250 μm, N=15~275 μm, D3/N=0.03~16.7. In preferably embodiment, D3=112 μm, N=100 μm, D3/N=1.12.

In this embodiment, materials of the first electroplated coating 40 and the first connecting portion 50 are copper. Thus, manufacturing the second hole 52 is become easier, and a high aspect ratio of the second connecting pins 60 is become easier.

In this embodiment, from S2 to S4 further including following steps:

S20: referring to FIG. 2, opening at least one third hole 23 on the first substrate 10. The auxiliary metal coating also formed on sides of the hole 23. The third hole 23 is throughout of the first copper coating 121 and the first base layer 11. The second copper coating 122 is exposed from the third hole 23. A cross-section the third hole along the first direction P is trapezoid. The third hole 23 has a third end 24 and a fourth end 25 relative to the third end 24. A projection of the third end 24 and a projection of the fourth end 25 along the first direction P are circular. A diameter of the third end 24 is marked as R1, a diameter of the fourth end 25 is marked as R2, R1>R2. R1=60~120 μm, R2=30~50 μm. A depth of the third hole 23 marked as D4, a depth of the first hole 20 is marked as D3, D3=D4=D1+D2.

S30: referring to FIG. 5, the first electroplated coating 40 is further formed on the first copper coating 121 and the auxiliary metal coating. The first electroplated coating 40 is also filled into the third hole 23 to form a third connecting pin 51. The third connecting pin 51 is used to as input or output end to couple with another electronic component. In this embodiment, the aspect ratio of the third connecting pin 51 is D4/R1, D4=112 μm, R1=100 μm, D4/R1=1.12.

Referring to FIG. 6, the step S4 further includes:

Etching the first copper coating 121 and a portion of the first electroplated coating 40 corresponding to the first copper coating 121 to form an inner line layer 13. A portion of the first base layer 11 is exposed from the inner line layer 13 to obtain a first semi-finished protect 71.

In the method of manufacturing the circuit board 70 of the present disclosure, the second connecting pins have smooth outer surface to improve the stability of signal transmission and heat dissipation efficiency thereof. Furthermore, by opening the holes to form the third connecting pin 51 can improve production efficiency.

Figure 8:
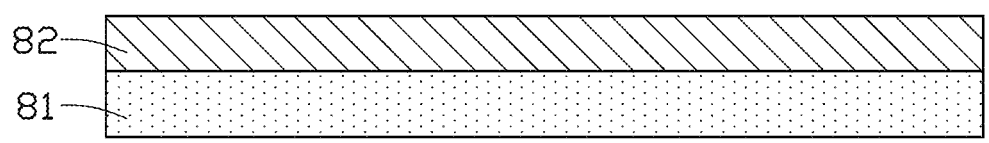
FIG. 8 is an isometric view of a second substrate covered with copper on one side thereof.

Referring to FIGS. 8~11, the present disclosure is described in relation to a method of manufacturing another circuit board. The method of manufacturing the circuit board including following steps:

S1: referring to FIG. 8, providing a second substrate 80, the second substrate 80 includes a second base layer 81 and a third copper coating 82 formed on a side of the second base layer 81.

Figure 9:
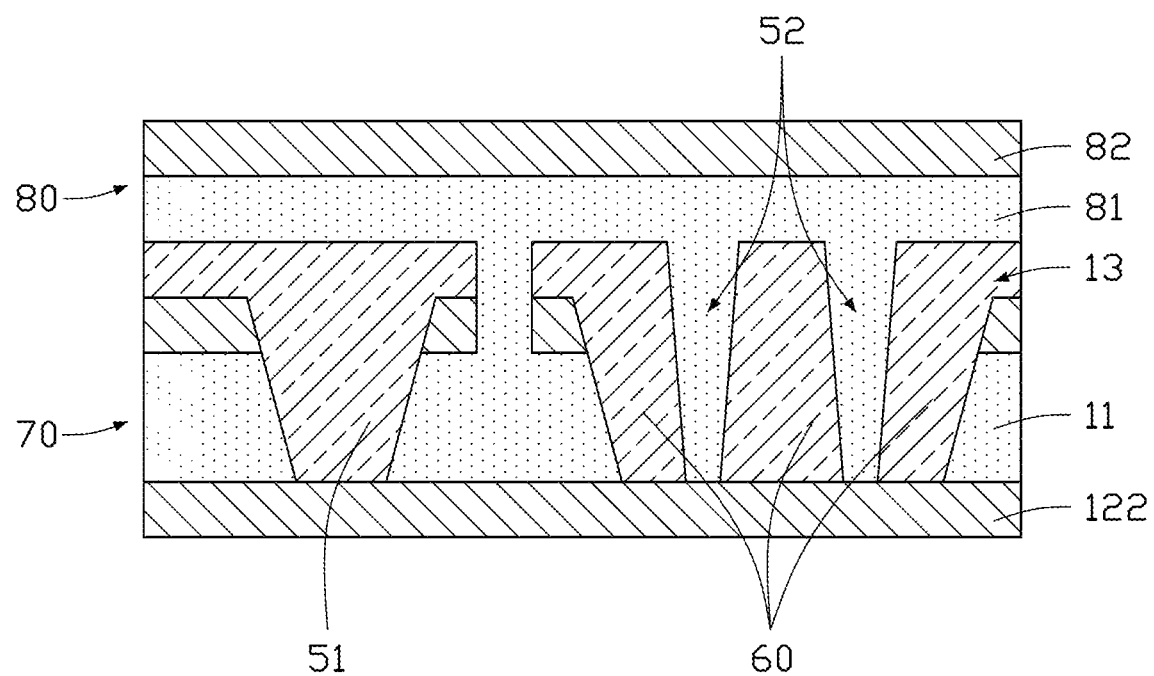
FIG. 9 is an isometric view of combining the semi-finished protect of the circuit board and the second substrate to form a second semi-finished protect.

S2: referring to FIG. 9, bonding the second substrate 80 on the first semi-finished protect 71. The second base layer 81 is toward to the inner line layer 13 and further filled into the second hole 52.

Figure 10:
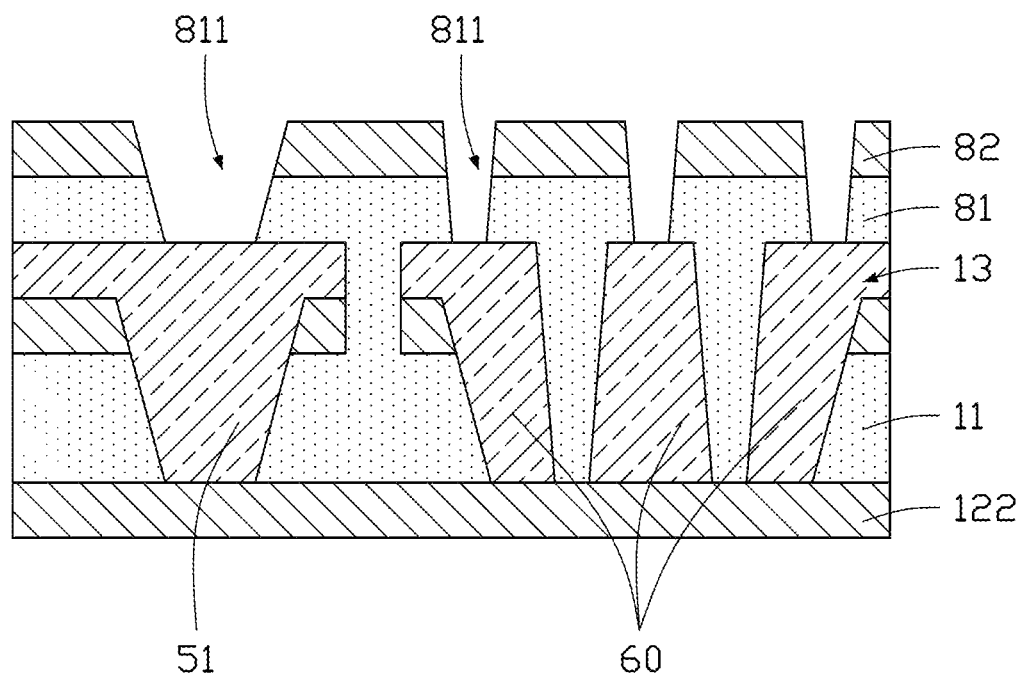
FIG. 10 is an isometric view of opening a third groove on the semi-finished protect of FIG. 9 to form a third semi-finished protect.

S3: referring to FIG. 10, opening a plurality of fourth holes 811 on the second substrate 80. The plurality of fourth holes 811 are throughout of the second substrate 80. The second connecting pins 60 are exposed from the plurality of fourth holes 811.

Figure 11:
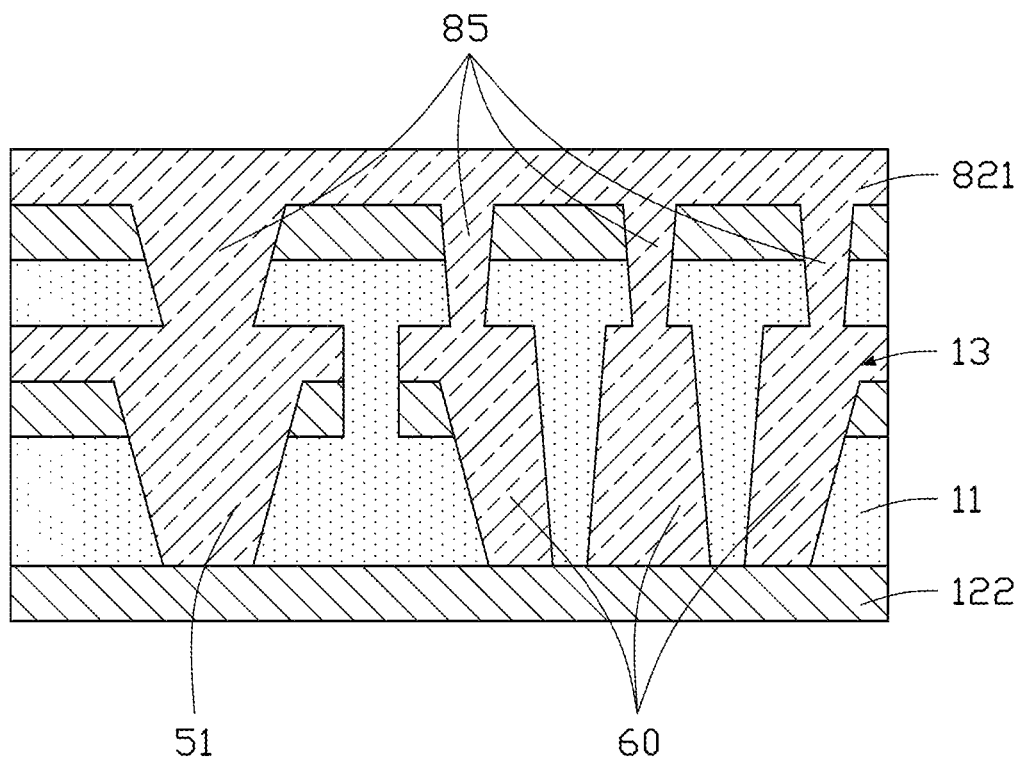
FIG. 11 is an isometric view of forming a second electroplated coating on the third semi-finished protect.

S4: referring to FIG. 11, forming a second electroplated coating 821 on the third copper coating 82. The second electroplated coating 821 is filled into the plurality of fourth holes 811 to form at least one fourth connecting pin 85. The fourth connecting pin 85 electrically connects to the second connecting pins 60. In this embodiment, the third connecting pin 51 is exposed from the fourth hole 811. The fourth connecting pin 85 also electrically connects to the third connecting pin 51.

Figure 12:
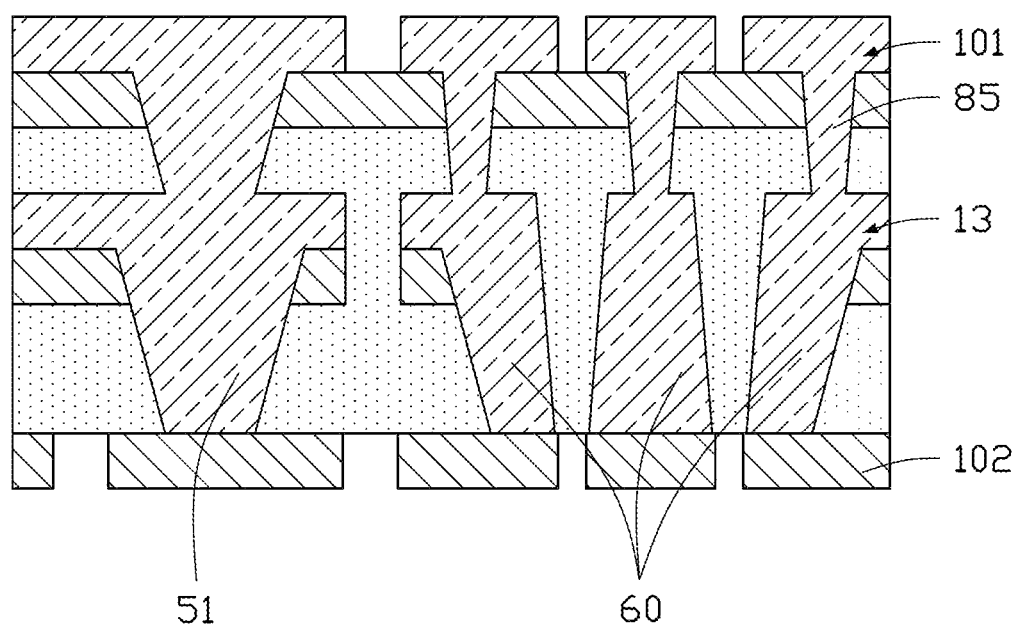
FIG. 12 is an isometric view of the circuit board of the present disclosure.

S5: referring to FIG. 12, etching the second electroplated coating 821 and the third copper coating 82 to gain a first outer line layer 101, and etching a second copper coating 122 to gain a second outer line layer 102, thus the circuit board 100 is manufactured completely.

In at least one embodiment, before forming a second electroplated coating 821, the method of the circuit board may further include forming a seed layer on side walls surrounding to form the fourth holes 811. The seed layer electrically connects to the inner line layer 13 and the third copper coating 82.

Referring to FIG. 12, the present disclosure is described in relation to the circuit board 100. The circuit board 100 includes the first outer line layer 101, the second base layer 81, the inner line 13, a first base layer 11 and a second outer line layer 102 arranged from top to bottom. The first hole 20 passes through the inner line layer 13 and the first base layer 11. The first connecting portion 50 is formed in the first hole 20. The first connecting portion 50 includes a plurality of second connecting pins 60 electrically connected to the second outer line layer 102 and the inner line layer 13. The plurality of second connecting pins 60 define at least one second hole 52. At least one fourth connecting pin 85 is formed between the first outer line layer 101 and the inner line layer 13. The fourth pin 85 connects to the second connecting pins 60. The second base layer 81 is filled into the inner line layer 13 and the second hole 52.

The embodiments shown and described above are only examples. Many details are often found in the art such as the other features of a method of manufacturing the base plate and the circuit board. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A circuit board comprising:
    a first outer line layer, a second base layer, an inner line layer, a first base layer, and a second outer line layer arranged from top to bottom, the inner line layer comprising a first copper layer and a first electroplated layer, the first copper layer being sandwiched between the first electroplated layer and the first base layer;
    a first hole extending through the inner line layer and the first base layer;
    a first connecting portion formed in the first hole and being in contact with a sidewall of the first hole, the first connecting portion defining two second holes to divide the first connecting portion into three second connecting pins, the three second connecting pins being arranged in the first hole along a single direction, and connected to the second outer line layer and the inner line layer, the first electroplated layer being integrally formed with the three second connecting pins, adjacent two of the three second connecting pins being spaced from each other by one of the two second holes; and
    at least one fourth connecting pin connected between the first outer line layer and the inner line layer.

2. The circuit board of claim 1, wherein the at least one fourth connecting pin is connected to the three second connecting pins, and the second base layer is filled into the inner line layer and the second hole.

3. The circuit board of claim 1, further comprising:
    a third hole extending through the inner line layer and the first base layer;
    a third connecting pin formed in the third hole.

4. The circuit board of claim 3, wherein the first base layer comprises a first direction defined along a length direction of the first base layer; the third hole defines a third end and a fourth end opposite to the third end, a projection of the third end and a projection of the fourth end in the first direction are circular.

5. The circuit board of claim 1, wherein the first base layer comprises a first direction defined along a length direction of the first base layer; a cross-section of the first hole in the first direction is trapezoidal, the first hole defines a first end and a second end relative to the first end, a length of the first end on the cross-section of the first hole is larger than a length of the second end on the cross-section of the first hole.

6. The circuit board of claim 1, wherein a projection of ends of the three second connecting pins away from the second outer line layer are rectangular, a length of the projection is in a range of 180 µm to 280 µm, a width of the projection is in a range of 15 µm to 275 µm, a depth of the three second connecting pins is in a range of 8 µm to 250 µm.

7. The circuit board of claim 1, wherein a first direction is a length direction of the first base layer and a second direction is a width direction of the first base layer, the second direction is perpendicular to the first direction; an aspect ratio of the three second connecting pins along the first direction is in a range of 0.03 to 1.40, and the aspect ratio of the three second connecting pins along the second direction is in a range of 0.03 to 16.7.

8. The circuit board of claim 1, wherein a portion of the first base layer is exposed from the inner layer.

9. The circuit board of claim 1, wherein the first base layer comprises at least one of polypropylene (PP), polyimide (PI), benzocyclobutene (BCB), liquid crystal polymer (LCP), and polytetrafluoroethylene (PTEE).

* * * * *